(12) United States Patent
Omizo

(10) Patent No.: US 6,261,919 B1
(45) Date of Patent: Jul. 17, 2001

(54) SEMICONDUCTOR DEVICE AND METHOD OF MANUFACTURING THE SAME

(75) Inventor: Shoko Omizo, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/413,860

(22) Filed: Oct. 7, 1999

(30) Foreign Application Priority Data

Oct. 9, 1998 (JP) .................................................. 10-287970

(51) Int. Cl.$^7$ .................................................. H01L 21/76
(52) U.S. Cl. .................. 438/401; 438/462; 438/975; 438/113; 438/114; 438/459; 438/464
(58) Field of Search ................................. 438/401, 462, 438/113, 975, 114, 459, 464

(56) References Cited

U.S. PATENT DOCUMENTS

| | | | |
|---|---|---|---|
| 4,418,467 | * 12/1983 | Iwai | 29/574 |
| 5,972,234 | * 10/1999 | Weng et al. | 216/44 |
| 6,004,405 | * 12/1999 | Oishi et al. | 148/33.2 |
| 6,063,695 | * 5/2000 | Lin et al. | 438/462 |
| 6,066,513 | * 5/2000 | Pogge et al. | 438/113 |

FOREIGN PATENT DOCUMENTS

| | | |
|---|---|---|
| 4-106960 | 4/1992 | (JP) . |
| 8-191038 | 7/1996 | (JP) . |
| 11-156565 | 6/1999 | (JP) . |

* cited by examiner

*Primary Examiner*—Matthew S Smith
*Assistant Examiner*—Victor V. Yevsikov
(74) *Attorney, Agent, or Firm*—Finnegan, Henderson, Farabow, Garrett & Dunner, L.L.P.

(57) ABSTRACT

A mark of a semiconductor device is formed of a molten trace obtained by selectively applying a laser to a ground back surface of a semiconductor substrate. Since the molten trace mark is formed in a form of a planarized surface on a back surface of a wafer or a chip which has been rendered uneven by grinding, visual recognition of the mark can be improved. Furthermore, since the mark is not deeply inscribed into the wafer or the chip, unlike the case of a dot mark, it is possible to maintain a die strength at a high level. In particular, when the molten trace mark is formed by using SHG-YAG laser, it is possible to suppress the depth of the layer from being thermally influenced, up to about several $\mu$m. As a result, it is possible to suppress thermal influence upon the inner circuit formed in a silicon chip and wiring formed therein.

8 Claims, 5 Drawing Sheets

SEMICONDUCTOR DEVICE AND METHOD OF MANUFACTURING THE SAME

BACKGROUND OF THE INVENTION

The present invention relates to a mechanism of how to create a mark such as a letter, numeric character, or symbol, to be inscribed to a semiconductor device and a method of inscribing the mark. More particularly, the present invention relates to a method of applying a laser mark onto an exposed back surface of a silicon chip, which has conductive balls serving as external contact terminals attached on a front surface, and which is mounted on a wiring substrate in a flip-chip manner.

A semiconductor device is usually produced through a designing step, a mask-formation step, a wafer manufacturing step for forming a wafer from an ingot, a wafer processing step for forming an inner circuit such as a semiconductor element or an integrated circuit on the wafer, an assembly step and an inspection step.

A mark such as a letter, numeric character, or symbol indicating a product name or a pin number is conventionally inscribed on the margin on a surface of a semiconductor chip. The mark is integrally formed as a part of the margin of an inner circuit pattern of a chip while the chip maintains a wafer form before scribing. Thus, generally, a back surface of the chip has not been used for marking.

However, there is another type of chip having conductive balls (serving as external contact terminals) fitted to a front surface which has an inner circuit, such as an integrated circuit or a semiconductor element, formed thereon. In this case, the chip is mounted on a wiring pattern of a circuit board with the conductive balls interposed therebetween. The chip of this type has a following problem. Although an exposed wiring portion is protected, the chip is not sealed with a resin. As a natural consequence, the back surface of the semiconductor substrate is not protected. In such a circuit device having a chip mounted on a circuit board in such a way that a front surface of the chip faces the circuit board, it is impossible to identify a product name of a chip mounted on the circuit board during inspection even if a malfunction of the circuit device takes place. To overcome this, a mark such as a letter, numeric character, or symbol comes to be inscribed on a back surface of the chip, namely, a back surface of a wafer (Japanese Patent Application KOKAI Publication Nos. 4-106960, and 8-191038).

The mark such as a letter, numeric character, or symbol formed on the wafer or the chip is conventionally created by continuously arranging a plurality of dots formed by a laser.

The conventionally-employed laser mark is inscribed by a laser such as a YAG laser on a surface such as a back surface of a silicon wafer or its front surface having an element formed therein, so that the mark can be visually recognized. When the mark is inscribed on a silicon chip, the laser is applied in such a way that dots are not linked with each other in order to reduce damage.

FIGS. 1A to 1C are cross-sectional views of a silicon wafer sequentially showing conventional marking processes. A silicon wafer 1, which is sliced from a rod, is subjected to a lapping operation, and then, sent to a wafer processing step. In this operation, an inner circuit such as a semiconductor element or an integrated circuit, is formed. Accordingly, the silicon wafer 1 has a back surface 3 rendered uneven to a predetermined level by the lapping operation, and a front surface 2 having a plurality of chip formation regions in each of which a semiconductor element and an integrated circuit are formed. The mark such as a letter, numeric character, or symbol is inscribed on, for example, the back surface 3 of the wafer 1 by using a YAG laser. Alternatively, the mark may be inscribed on a back surface of the chip after the wafer 1 is diced into chips. The mark is formed of combination of a plurality of dots 5 (a depth of about 5 $\mu$m), which are formed by applying a laser beam 4 (a beam diameter of about 120 $\mu$m) onto the back surface 3 of the wafer.

However, even if care is taken to avoid linkage of dots in order to reduce damage, the application of a laser beam during the mark inscription produces cracks in the wafer having a thickness of about 500 $\mu$m at most. As a result, a mechanical strength of the wafer is inevitably reduced. When the marking is performed in this method, it is not possible to create a fine-logo mark. Therefore, the fine-logo mark must be omitted in some cases. Although it is possible to create dots continuously to create fine marks, the mechanical strength of a wafer significantly reduces.

BRIEF SUMMARY OF THE INVENTION

An object of the present invention is to provide a semiconductor device having a highly visible mark which is formed without digging a semiconductor substrate deeply and having an excellent die strength, and to provide a method of manufacturing the semiconductor device.

To attain the aforementioned object, the semiconductor device according to a first aspect of the present invention comprises a semiconductor substrate having a front surface with an inner circuit formed therein and a ground back surface; and a mark formed of a molten trace on the ground back surface.

The semiconductor device may further comprise a plurality of contact electrodes formed on the front surface of the semiconductor substrate;

a plurality of contact terminals each being formed of a conductive ball and electrically connected to the inner circuit via a corresponding one of the contact electrodes.

A semiconductor device according to a second aspect of the present invention comprises a circuit board having a plurality of electrode pads in a front surface thereof;

a plurality of semiconductor chips mounted on the circuit board, each of the semiconductor chips having a front surface with an inner circuit formed therein and a ground back surface;

a plurality of contact electrodes formed on the front surface;

a plurality of contact terminals each formed of a conductive ball and electrically connected to the inner circuit via a corresponding one of the contact electrodes and each being connected to a corresponding one of the electrode pads of the circuit board; and a mark formed of a molten trace on the ground back surface.

In the semiconductor device according to the first and second aspects, the ground back surface of the semiconductor substrate has an uneven surface and the mark is formed by melting and planarizing the uneven surface.

According to a third aspect of the present invention, there is provided a method of manufacturing a semiconductor device comprising the steps of:

forming an inner circuit in each of a plurality of chip formation regions in a front surface of a semiconductor wafer;

forming an uneven surface by grinding a back surface of the semiconductor wafer; and forming a mark of a molten trace by a laser in regions of the ground back surface corresponding to the chip formation regions.

The method of manufacturing a semiconductor device may further comprise the steps of:

dicing the semiconductor wafer to separate the chip formation regions; and forming a plurality of semiconductor chips.

The method of manufacturing a semiconductor device may further comprise steps of forming a contact electrode on a front surface of each of the semiconductor chips, and attaching a contact terminal formed of a conductive ball to the contact electrode.

In the step of forming the mark includes the step of melting projections of the uneven surface of a back surface of the semiconductor wafer by a laser to partially form a molten and planarized portion.

It is desirable that the method of the present invention further comprise the steps of:

measuring a difference in height between the molten and planarized portion and the projections;

detecting an intensity of the laser based on measurement results; and controlling output of the laser based on detection results.

It is desirable that the laser be a YAG laser modulated by an SHG device.

It is desirable that an energy of the laser be $1.0 \times 10^7$ W/cm$^2$ or less.

It is desirable that the step of forming the mark by the laser be performed in conditions under which temperature of the back surface of the semiconductor wafer increases within a depth of 4 μm measured from the back surface.

As described in the above, the present invention is characterized in that a laser mark constituted of a molten trace is inscribed to a back surface of the silicon semiconductor substrate rendered uneven by grinding in a wafer form or a chip form.

Particularly, it is possible to improve visual recognition of the mark since the marking is applied onto a back surface of the wafer or the chip surface rendered uneven by grinding. Furthermore, since the mark is not inscribed deep in the wafer or the chip unlike a dot mark, it is possible to maintain a die strength at a high level. In particular, when the molten trace mark is formed by using SHG-YAG laser, it is possible to suppress the depth of the layer of the chip subjected to thermal influence upon the inner circuit, within about several μm. As a result, the laser mark can be formed without having a significant thermal effect upon the inner circuit of a silicon chip having an element and wiring formed therein.

Furthermore, the present invention can provide the most suitable mark for use in a BGA (Ball Grid Array, registered by Motorola) type chip to be mounted on a circuit board while the back surface of the chip is exposed upward.

Moreover, in the marking method of the present invention, since the surface state of the molten trace can be monitored, output of a laser can be controlled by feeding the monitoring results back to a control apparatus for a laser.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

Figure 2A:
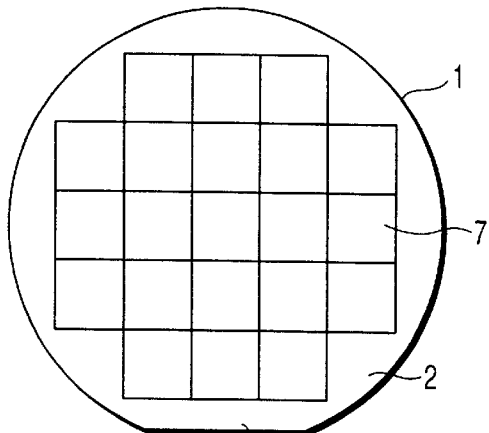
FIGS. 2A and 2B are views for explaining a chip formation region and a marking site of a silicon wafer (FIG. 2A shows a front surface and FIG. 2B shows a back surface of the wafer)
Figure 2B:
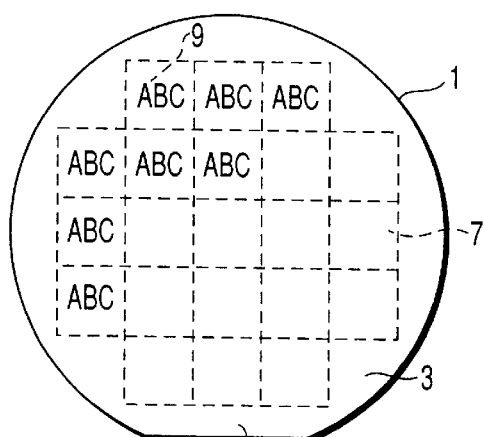
Figure 3A:
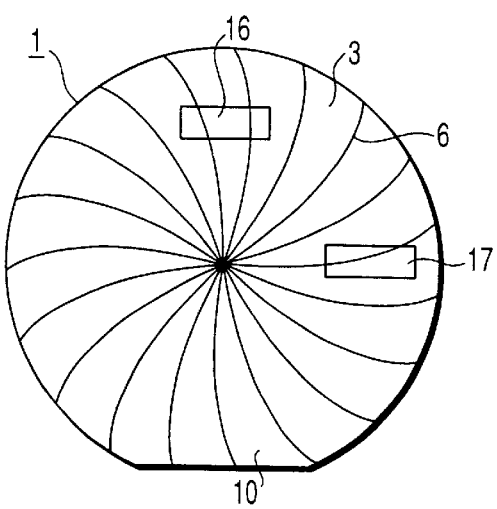
FIGS. 3A and 3B are plan views of a back surface of a wafer for explaining the relationship between grind marks formed by grinding a back surface of the wafer and a chip cutting direction.
Figure 3B:
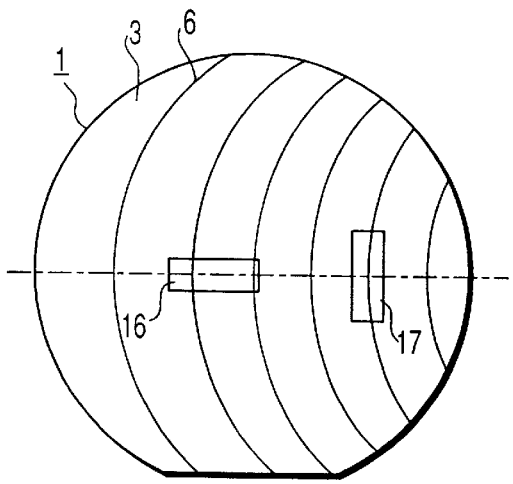

In the first place, the marking method of the present invention will be explained with reference to FIGS. 2A, 2B, 3A and 3B. FIGS. 2A and 2B are plan views respectively showing front and back surfaces of a silicon wafer. FIGS. 3A and 3B are plan views of the back surface of a wafer showing grind marks formed by grinding the back surface. A silicon wafer used in this embodiment is formed of a columnar ingot formed by a conventionally-known single crystalline growth method such as a radio-frequency heating method or a pulling method. The shape of a wafer 1 is, for example, a disk form. To easily detect a crystal orientation of the wafer surface during a manufacturing process of a semiconductor device, for example, an orientation flat 10 or a notch is formed at a wafer edge. First, a semiconductor single crystalline ingot, for example, a silicon ingot is formed in accordance with either one of the aforementioned growth methods. Then, the ingot is partially cut off along a columnar axis direction by grinding, whereby a cut portion is formed at a side surface. Then, the ingot is sliced in a plate form to obtain a plurality of wafers 1 in a semicircular or a circular form having an orientation flat 10 (which appears to be formed by partially cutting the circumference of the wafer) or a notch.

Then, a back surface of the wafer 1 is subjected to a lapping operation. More specifically, a slurry which is a mixture of grit or powder and a lapping solution, is placed between a lapping plate and the wafer. Then, the lapping plate and the wafer are relatively moved while pressure is applied to them. Due to the rotation movement of the grit, the wafer surface is smoothened highly uniformly. Thereafter, to form an inner circuit therein, the front surface thereof is polished to form a mirror surface. More specifically, the high-quality mirror surface is formed by polishing the front surface with further smaller grains than the lapping grains while a mild or viscoelastic material is placed on the lapping plate. In the foregoing outlined the wafer manufacturing step.

Next, a wafer processing step is performed. In this step, several steps including a thin-film formation step and an oxidation step, are performed to form an inner circuit pattern in each of chip formation regions 7 of the front surface 2 of the wafer (see FIG. 2A). After the inner circuit pattern is formed, in other words, after the processing step of the wafer is completed, the wafer is reduced in thickness by grinding the back surface while a grinding wheel is rotated.

Figure 4A:
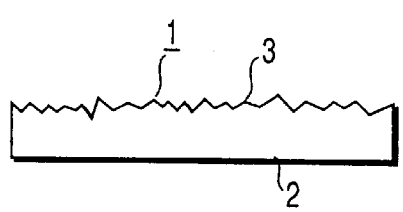
FIGS. 4A to 4C are cross-sectional views of a wafer for explaining the steps of a marking method of the present invention, sequentially.
Figure 4B:
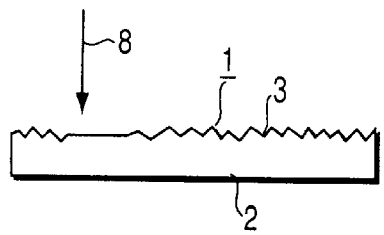
Figure 4C:
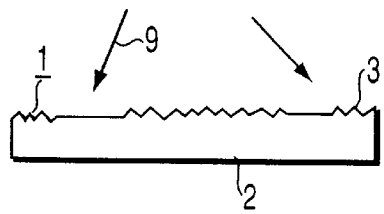

The back surface 3 of the wafer becomes uneven by grinding the back surface as shown in FIG. 4. In addition, grind marks are formed on the back surface 3 by relatively moving the wafer to the grinding wheel, as shown in FIGS. 3A and 3B. FIG. 3A shows grind marks called "in-feed type" formed by relatively rotating them while the grinding wheel moves from an end to a center of the wafer. FIG. 3B shows grind marks called "through-feed type" formed by relatively rotating them while the grinding wheel moves from an end to the other end of the wafer.

Now, the wafer is cut along a scribe line to form a plurality of chips. These chips are processed in the next assembly step to be completed as a product. Before or after entering the assembly step, the marking is performed. In other words, the marking is applied to the semiconductor substrate in a wafer form or in a chip form.

For example, a mark 9 such as a product name, a lot number, or a pin mark, is inscribed on the chip region 7 of the wafer back surface 3 under which the inner circuit pattern is formed, by use of a molten trace formed by a YAG laser. In FIG. 2B, "ABC" is written as an example of the mark. The marking is desirably performed in a time period having no effect upon other process, for example, before the dicing step.

The wafer having marks inscribed thereon is cut along a scribe line to separate a plurality of chips. These chips are packaged and subjected to several tests including a die-sorter test and a product test, and thereafter, completed as a semiconductor device.

Figure 5A:
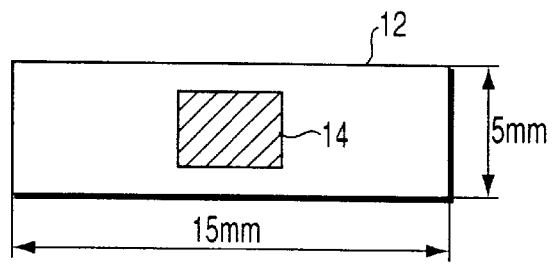
FIGS. 5A and 5B are plan views of a chip on which a mark is inscribed in accordance with the marking method of the present invention, (FIG. 5A shows a plane mark and FIG. 5B shows a three-line mark)
Figure 5B:
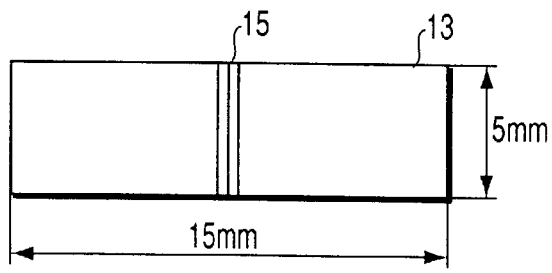

When the marking is applied to the chip, marks 14 and 15 are formed on the back surface of the chip 12, as shown in FIGS. 5A and 5B. The marking may be performed after an inspection step (test step). In this embodiment, marking is applied to a semiconductor substrate either in a wafer form or in a chip form.

Next, referring to FIG. 4, how to create a mark on the back surface of a wafer will be explained according to the method of the present invention. As shown in FIG. 4, a YAG laser light 8 is applied onto the back surface 3 of the wafer 1 having a thickness of about 500 $\mu$m. As viewed from above, the laser light is applied to a mark formation region of the chip region 7 in FIG. 2B. When the laser light is applied, irradiated portions of the uneven surface are melted. The melted portions are solidified again to form flat portions. The mark 9, for example, "ABC", is represented by the flat portions.

To be more specific, as shown in FIG. 4, the back surface 3 of the wafer 1 is ground to form an uneven surface having microscopic projections and depressions. The differences in depth between the projections and depressions are utmost about 0.1 to 0.2 $\mu$m. A conventional mark 5 is formed of inscribed dots, whereas the mark 9 of the present invention is formed of a flat molten surface formed by melting the projections on the surface and leveling them with the depressions. Since the region of the mark 9 is formed of a flat and molten surface, whereas other region around it still remains uneven, the visual recognition of the mark can be improved by the contrast between both regions.

Figure 1A:
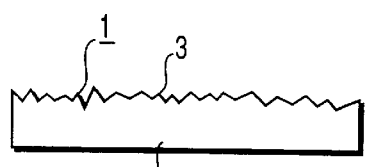
FIGS. 1A to 1C are cross-sectional views of a wafer sequentially showing the steps of a conventional marking method.
Figure 1B:
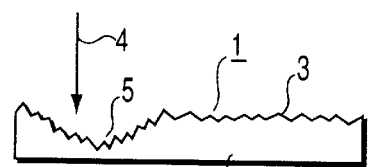
Figure 1C:
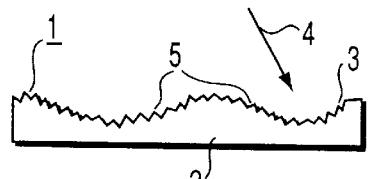

In contrast, in the conventional dot-mark method, as shown in FIG. 1, when a laser light 4 is applied to the back surface 3 of the wafer, the irradiated portion is melted and flies off to form a dot 5 of about 5 to 10 $\mu$m in depth. In the dot mark method, a plurality of dots 5 are arranged in line to form a mark.

Now, referring to FIGS. 5A, 5B to 10A, 10B, there will be explained characteristics of the chip having the mark inscribed by the method of the present invention.

In this embodiment, five samples S1 to S5 (described below) are prepared and compared for characteristics. S1 is a chip obtained by cutting a wafer having a YAG molten trace mark formed by a YAG laser (wavelength: 1.064 $\mu$m). S2 is a chip obtained by cutting a wafer having an SHG-YAG molten trace mark formed by an SHG-YAG light (wavelength: 0.532 $\mu$m) which is obtained by modulating the YAG laser by use of an SHG (Second Harmonic Generation) device. S3 is a non-marked chip. S4 is a chip formed by cutting a wafer having a discontinuous YAG dot mark conventionally formed by discretely arranging dots inscribed by a YAG laser light. S5 is a chip formed by cutting a wafer having a continuous YAG dot mark conventionally formed by continuously arranging dots inscribed by a YAG laser light.

FIGS. 5A and 5B show the silicon chips 12 and 13, which are used as test samples. They are rectangular chips of 15 mm (long side)×5 mm (short side) having a thickness of 0.35 mm. The marks 14 and 15 are formed on the back surfaces of the chips 12 and 13, respectively, by the method of the present invention. As the silicon chip, a chip obtained by dicing a mirror wafer and having no circuit pattern formed therein, is used.

The mark 14 formed at a center of the chip is a plane pattern of 4 mm square. The chip 12 having such a plane mark 14 is called a "plane mark chip". The mark 15 is formed at a center of the chip and constituted of three lines in parallel to the short side. The chip 13 having the mark 15 is called a "three-line mark chip". The no-marked chip 3 is called a "no-mark chip", which has the same outer dimensions as those of the aforementioned chips. The chips S4 and S5 have the same outer dimensions as those used in the cases of the silicon chips of FIGS. 5A and 5B and have the same shaped mark conventionally formed thereon.

The mechanical strength of the silicon chip varies also depending upon how to cut chips from a wafer. As shown in FIGS. 3A and 3B, grind marks 6 are formed on the back surface 3 of the wafer by grinding the back surface 3. Accordingly, the back surface of the chip cut from the wafer inevitably has grind marks. Depending upon how to cut the wafer 1, different marks are formed which include a chip 16 (vertical grind mark chip) having the grind marks 6 formed in perpendicular to the long side of the wafer 1 and a chip 17 (horizontal grind mark chip) having the grind marks 6 formed in parallel to the long side.

Figure 6:
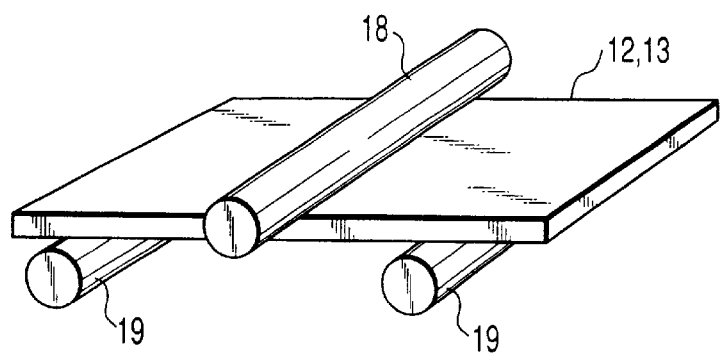
FIG. 6 is a perspective view showing a method of testing a die strength of a chip of the present invention.

These chips are tested for die strength in accordance with a method shown in FIG. 6. As shown in FIG. 6, a chip 12 or 13 is mounted on two parallel rod-form fulcrums 19. Then, the portion of the chip 12 or 13 sandwiched between the two fulcrums 19 is pressurized by a rod-form pressurizing body 18 at a constant speed. The die strength is represented by a bending strength at the time the chip 12 or 13 breaks down.

The YAG molten trace mark (formed by a YAG laser) is marked on the wafer under the conditions: Q switch frequency of 50 kHz, an average output of 22.8 W, a pulse width of 500 ns, and a drawing speed of 500 mm/s. The conventional discontinuous YAG dot mark is marked on the wafer under the conditions: Q switch frequency of 6 kHz, an average output of 7.6 W, a pulse width of 83.1 ns, and a drawing speed of 650 mm/s. The conventional continuous YAG dot mark is marked under the conditions: Q switch frequency of 6 kHz, an average output of 7.6 W, a pulse width of 83.1 ns, and a drawing speed of 350 mm/s.

Figure 7:
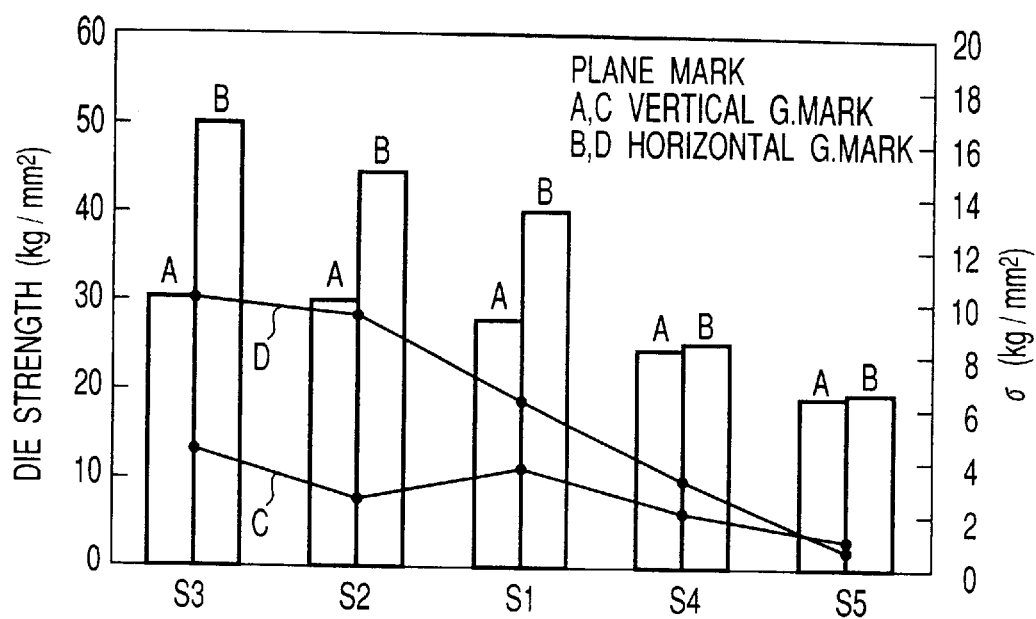
FIG. 7 is a characteristic graph showing the test results of a die strength of the plane mark inscribed on a chip by various methods.
Figure 8:
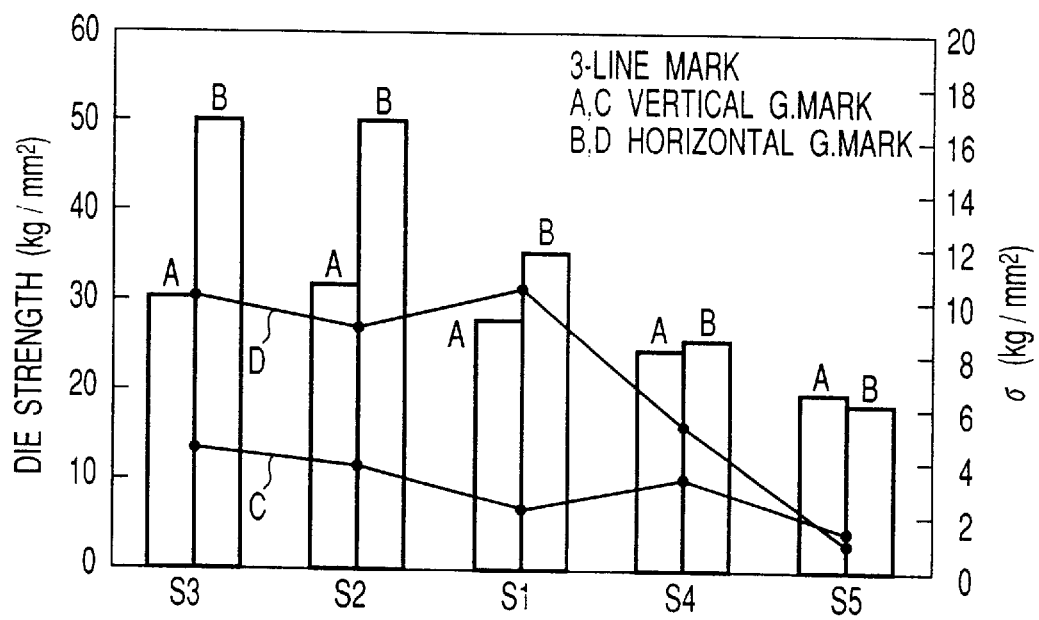
FIG. 8 is a characteristic graph showing the test results of a die strength of the three line mark inscribed on a chip by various methods.

Various sample chips with and without a mark are compared for die strength as shown in FIGS. 7 and 8. FIG. 7 shows the results of the die strength test with respect to plane mark chips 12 (FIG. 5A) marked by various methods. FIG. 8 is the results of the die strength test with respect to three line mark chips 13 (FIG. 5B) marked by various methods. The chips used in this test are cut from the in-feed type wafer having grind marks shown in FIG. 3A. Comparison are made between YAG molten trace mark chip S1, SHG molten trace mark chip S2, no mark chip S3, discontinuous YAG dot mark chip S4, and continuous YAG dot mark chip S5. Comparison is also made between chips different in cutting direction.

In FIGS. 7 and 8, the vertical grind mark chip is compared to the horizontal grind mark chip (both shown as "VERTICAL G. MARK" and "HORIZONTAL G. MARK" in FIGS. 7 and 8). Bar A indicates the die strength of the vertical grind mark chip. Bar B indicates the die strength of the horizontal grind mark chip. Unit is kg/mm² and plotted on the ordinate on the left-hand side. A line graph C shows variations in die strength of the vertical grind mark chip (90 degree σ). A line graph D shows variations in die strength of the horizontal grind mark chip (0 degree σ). The unit is kg/mm² and plotted on the ordinate on the right-hand side. The abscissa of FIGS. 7 and 8 represent chips S1 to S5. Assuming that u is a variation from an average value and n is the number of data, there is a following relationship:

$$\sigma n-1=((n-1)^{-1}\cdot(\Sigma xi^2-(\Sigma xi)^2/n))^{1/2}$$

As is shown in FIGS. 7 and 8, it appears natural that no mark chip S3 has the largest die strength. It is found that the chips S1 and S2 with the marks formed by the method of the present invention are larger in die strength than the conventional chips S4 and S5, except no mark chip S3.

The die strength is not varied depending upon the grindmark formation direction in chips S4 and S5, whereas in the chips of the present invention, the die strength differs depending upon the grind mark formation direction. The vertical grind mark chip 16 is smaller in die strength than the horizontal grind mark chip 17. This tendency is common in FIGS. 7 and 8.

The lines C and D compare a plurality of samples with respect to variation in die strength. No-mark chip S3 exhibits a large variation in die strength. Since the chip is free from effect of the mark, it is a matter of course that the variation in die strength of no-mark chip S3 directly represents that of the chip itself. In the chips S1 and S2 of the present invention, the variation in die strength is more or less smaller than that of no mark chip S3, however larger than those of the chips S4 and S5. The variations of S1 and S2 are close to that of the chip itself. As a result, it is demonstrated that the mark have a little effect upon the die strength of the chips S1 and S2 of the present invention.

Figure 9A:
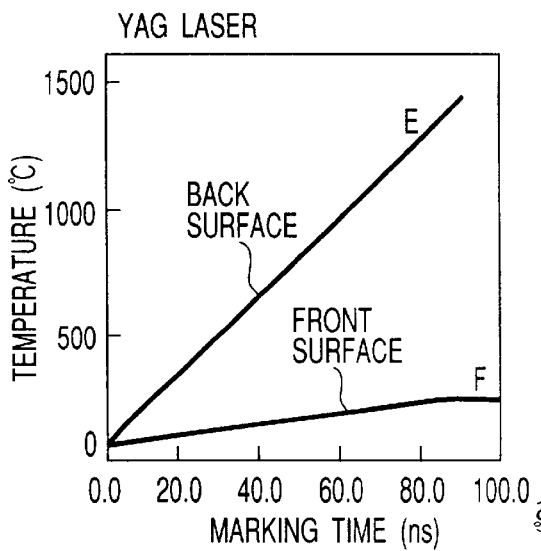
FIGS. 9A and 9B are characteristic graphs showing a temperature change with time in upper and lower surfaces of a wafer during the marking of the present invention, (FIG. 9A shows the case where a YAG laser is used and FIG. 9B shows the case where SHG-YAG laser is used for the marking)
Figure 9B:
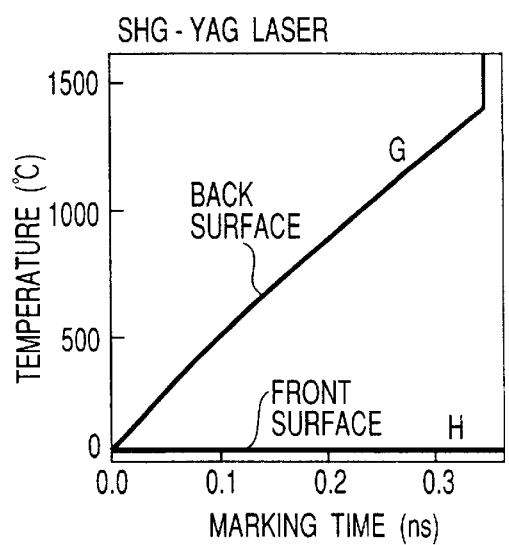

Now, referring to FIGS. 9A and 9B, there will be explained the temperature change of a wafer when the marking is performed in accordance with the method of the present invention. These figures indicate a change in temperature with time of the front surface and back surface of the wafer during the marking. FIG. 9A shows a case where a YAG laser is used. FIG. 9B shows a case where SHG-YAG laser is used. The ordinate indicates temperature of a wafer during the marking. The abscissa indicates a time period (ns) required for the marking. Curves F and H indicate temperatures of the front surface. In either case, since a mark is applied to a back surface, heat is not transmitted to the opposite front surface, with the result that an increase in the surface temperature is considerably low.

Figure 10A:
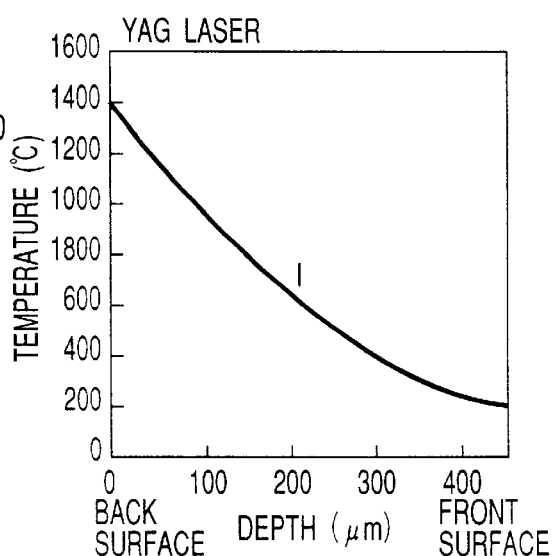
FIGS. 10A and 10B are characteristic graphs showing a temperature change in a wafer-depth direction during the marking of the present invention, (FIG. 10A shows a temperature profile in a wafer-thickness direction when the YAG laser is used and FIG. 10B shows a temperature profile from the back surface to a depth of 10 μm when a YAG laser is used in comparison with SHG-YAG laser.
Figure 10B:
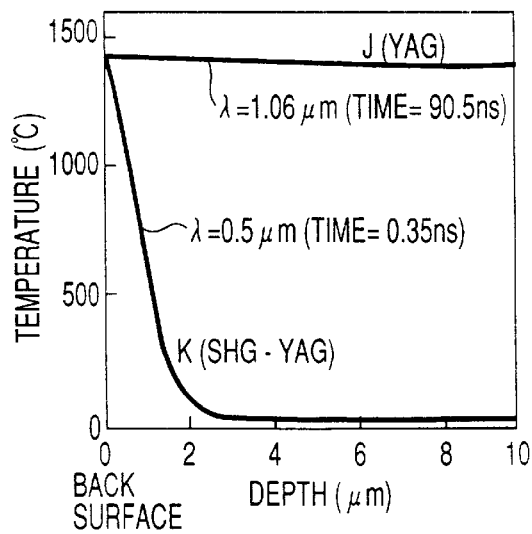

Each of FIGS. 10A and 10B shows a change in temperature in a depth direction of the wafer. The ordinate represents wafer temperature (° C.). The abscissa represents a depth ($\mu$m) of the wafer. FIG. 10A shows a case where a YAG laser is used (irradiation time: 90.5 ns). The leftmost side of the abscissa is the back surface. The rightmost side of the abscissa is the front surface. FIG. 10B shows a temperature profile from the back surface of the wafer to a depth of 10 $\mu$m in each of the cases where the YAG laser (irradiation time 90.5 ns) and the SHG-YAG laser (irradiation time: 0.35 ns) are used.

As indicated by curve I of FIG. 10A, the back surface irradiated with a laser light reaches 1400° C., whereas the front surface is as low as about 200° C. Accordingly, a laser mark can be formed without having a thermal influence upon an inner circuit formed in the front surface side.

In FIG. 10B, curves J and K are characteristic curves showing temperature changes in the cases of the YAG laser and the SHG-YAG laser, respectively. Although the temperature is not significantly reduced up to the depth of about 10 $\mu$m in the case of the YAG laser (wavelength: 1.064 $\mu$m); however, in the case of SHG-YAG (wavelength: 0.532 $\mu$m), the temperature sharply decreases in the depth direction, with the result that almost normal temperature is obtained at a depth of 4 $\mu$m from the back surface. Therefore, if the mark is inscribed on the wafer in a depth of 4 $\mu$m or less, preferably, 1 $\mu$m or less, as measured from the back surface at which temperature is substantially increased, the laser mark can be formed without the thermal effect upon the semiconductor device even if the chip is reduced in thickness and a wiring layer is formed deeper in a thickness direction.

When the marking is performed in accordance with the method of the present invention, requisite energy is properly $1.0 \times 10^7$ W/cm² or less. If the energy level is raised from this value, a pit may be produced in an irradiation surface in the same way as in the case of forming a conventional dot mark.

Figure 11:
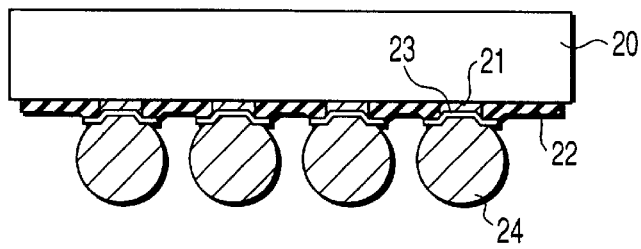
FIG. 11 is a cross-sectional view of a semiconductor device (chip) to which the marking of the present invention is applied.
Figure 12:
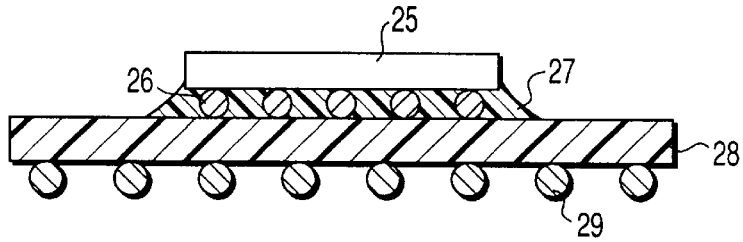
FIG. 12 is a cross sectional view of another semiconductor device to which the marking of the present invention is applied.

Since a laser mark such as a letter, numeric character, or symbol, is directly inscribed on a silicon chip, the present invention is advantageous in applying to a flip chip shown in FIGS. 11 and 12. In FIG. 11, the semiconductor chip is formed of a silicon semiconductor substrate 20. A contact electrode 21 is formed of, e.g., aluminium, is formed on a front surface thereof. The contact electrode 21 is connected to an inner circuit. The region of the front surface of the semiconductor substrate 20 excluding the region where the contact electrodes 21 are formed thereon, is coated and protected with a passivation film 22 such as an oxidation film. On the surface of the contact electrode 21, an interconnection member 23 is formed. On the member 23, a conductive ball 24 made of e.g., Pb—Sn solder is formed as a contact terminal.

FIG. 12 is a cross sectional view of a semiconductor device formed of a BGA board having a silicon chip mounted thereon. A BGA board 28 is a multilayered wiring board having a multi-wiring layer formed therein. The semiconductor device has a silicon chip 25 equipped with a plurality of contact terminals each constituted of a conductive ball 26 of solder or gold. The silicon chip 25 is connected, via the conductive ball 26, by a flip-chip bonding, to a first surface of the BGA board 28 constituted of the multi-wiring board using an insulating sheet formed of an organic material such as a BT (bismaleimide-triazine) resin and an epoxy resin. To a second surface of the BGA board 28, a plurality of contact terminals each constituted of a conductive ball 29 made of solder or gold, are attached. A fluid-state epoxy resin is introduced into a space between the BGA board 28 and the silicon chip 25, that is, the space having the conductive balls 26 therein. Then the epoxy resin is allowed to thermoset, whereby an under-fill resin layer 27 is formed.

Figure 13:
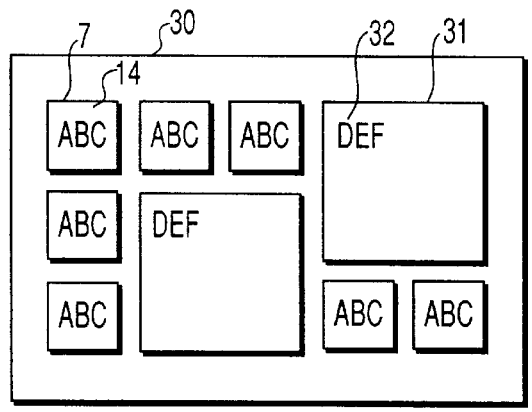
FIG. 13 is a plan view of a circuit board on which a semiconductor device (chip) of the present invention is mounted.

The semiconductor device described in FIGS. 11 and 12 is mounted on a circuit board 30 shown in FIG. 13. The circuit board 30 is a board having a circuit pattern formed thereon, such as a printed circuit board. More specifically, a whole system of the circuit board 30 is constructed by attaching, for example, a chip 7 (cut from the wafer shown in FIG. 2B) and another chip 31 of a BGA type having a different size onto the circuit pattern via the conductive balls. As described, since the laser marks 14 and 32 are directly formed on back surfaces of the silicon chips 7 and 31 in accordance with the method of the present invention, various inspection tests such as characteristic sorting of chips, can be performed easily.

Figure 14:
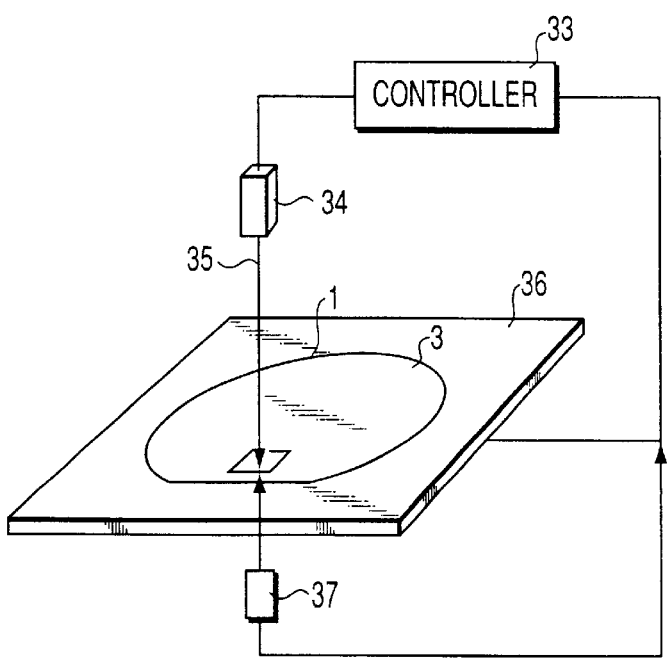
FIG. 14 is a schematic diagram for explaining a control system to be used in the marking method of the present invention.

Now, referring to FIG. 14, there will be explained how to control the laser marking to a wafer in the method of the present invention. In the present invention, the marking is performed on a ground back surface of the wafer in appropriate time after the grinding step. The marking step is characterized in that a part of the projections of the uneven back surface 3 of the wafer is melted to form partially a flat surface.

The wafer 1 is mounted on a process table 36. A laser apparatus 34 such as a YAG laser or SHG-YAG laser, and a monitor apparatus 37 for monitoring a surface state of the wafer 1 by measuring projections and depressions on the surface, are arranged near the processing table 36. Furthermore, a control apparatus 33 is arranged near the process table 36, for controlling the laser apparatus 34 based on monitoring results by a monitor apparatus 37. The mark such as a letter, numerical character, or symbol is formed by applying a laser light 35 to the back surface 3 of the wafer while the process table 36 is moved vertically and laterally. The monitor apparatus 37 measures the difference in height between the irradiated portion (melted and flattened by laser irradiation) and the projections. Based on the measurement results, intensity of the laser light is detected. The detection results are further fed back to the control apparatus 33 to thereby control the output of the laser apparatus 34. Since the output of the laser can be arbitrarily controlled by this method, a molten layer can be obtained in a desired thickness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming an inner circuit in each of a plurality of chip formation regions in a front surface of a semiconductor wafer;

forming an uneven surface by grinding a back surface of the semiconductor wafer; and forming a mark of a molten trace by a laser in regions of the ground back surface corresponding to the chip formation regions.

2. The method of manufacturing a semiconductor device according to claim 1, further comprising the steps of:

dicing the semiconductor wafer to separate the chip formation regions; and forming a plurality of semiconductor chips.

3. The method of manufacturing a semiconductor device according to claim 1, further comprising the steps of:

forming a contact electrode on a front surface of each of the semiconductor chips, and attaching a contact terminal formed of a conductive ball to the contact electrode.

4. The method of manufacturing a semiconductor device according to claim 1, wherein the step of forming the mark includes the step of partially melting projections of the uneven surface of a back surface of the semiconductor wafer by a laser to form a molten and planarized portion.

5. The method of manufacturing a semiconductor device according to claim 1, further comprising the steps of:

measuring a difference in height between the molten and planarized portion and the projections of the uneven surface;

detecting intensity of the laser based on measurement results; and controlling output of the laser based on detection results.

6. The method of manufacturing a semiconductor device according to claim 6, wherein the laser is a YAG laser modulated by an SHG device.

7. The method of manufacturing a semiconductor device according to claim 6, wherein an energy of the laser is $1.0 \times 10^7$ W/cm$^2$ or less.

8. The method of manufacturing a semiconductor device according to claim 1, wherein the step of forming the mark by the laser is performed in conditions under which temperature of the back surface of the semiconductor wafer increases substantially within a depth of 4 μm measured from the back surface.

* * * * *